United States Patent [19]

Nakaizumi

[11] Patent Number: 4,982,111

[45] Date of Patent: Jan. 1, 1991

[54] HIGH SPEED LATCHING CIRCUIT WITH LEVEL SHIFT OUTPUT CIRCUITS

[75] Inventor: Kazuo Nakaizumi, Tokyo, Japan

[73] Assignee: NEC Corporation, Tokyo, Japan

[21] Appl. No.: 294,707

[22] Filed: Jan. 9, 1989

[30] Foreign Application Priority Data

Jan. 8, 1988 [JP] Japan .................................. 63-1874

[51] Int. Cl.[5] .......................... H03K 3/26; H03K 3/29
[52] U.S. Cl. .................................... 307/279; 307/475;
307/291; 307/446; 307/272.1
[58] Field of Search ............ 307/279, 291, 292, 272.1,
307/446, 453, 440, 443, 272.2, 475

[56] References Cited

U.S. PATENT DOCUMENTS 4,695,743 9/1987 Des Brisay, Jr. ..................... 307/291
4,827,157 5/1989 Machida et al. ..................... 307/262

Primary Examiner—Timothy P. Callahan
Attorney, Agent, or Firm—Sughrue, Mion, Zinn, Macpeak & Seas

[57] ABSTRACT

For prompt response to an alternation of input signal, a latching circuit comprises two NAND gates each responsive to the input signal or the inverse thereof as well as an enable signal to produce an output signal or the inverse thereof, two level shifting circuits operative to shift the output signal and the inverse thereof in voltage level, and the controller providing a voltage level to partially define the shifting range of the output signal, and each of the level shifting circuits has a capacitor and two level shifters connected to the capacitor and the controller, respectively, so that the controller has no affection of the capacitor, thereby allowing the latching operation to be improved in speed.

7 Claims, 4 Drawing Sheets

PRIOR-ART

PRIOR-ART

HIGH SPEED LATCHING CIRCUIT WITH LEVEL SHIFT OUTPUT CIRCUITS

FIELD OF THE INVENTION

This invention relates to a latching circuit and, more particularly, to a latching circuit incorporated in, for example, a static type random access memory device.

BACKGROUND OF THE INVENTION

A typical example of the latching circuit is illustrated in FIG. 1 and largely comprises two NAND gates, two level shifters and a controller for preventing the complementary output signals from excessing a predetermined voltage level. In detail, Q31 to Q39 and Q3a to Q3c stand for respective depletion type field effect transistors, and D31 to D32 are indicative of diodes, respectively. C31 and C32 designate respective capacitances, and N31 to N36 are indicative of respective nodes provided in the latching circuit. The latching circuit is accompanied with two negative voltage sources Vss1 and Vss2, and the two negative voltage sources Vss1 and Vss2 produce negative voltage levels of $-1.5$ volt and $-3.3$ volts, respectively. These two negative voltage levels of $-1.5$ volt and $-3.3$ volts are hereinunder referred to as negative voltage levels Vss1 and Vss2, respectively. Input signals Din1 and Din2 complementarily shifted between the high and low voltage levels are supplied to the respective first input nodes IN1 and IN2 of the two NAND gates, and a clock signal CLK is shared by the two NAND gates. With the input signals Din1 and Din2 and the clock signal CLK. the latching circuit produces output signals Dout1 and Dout2 complementarily shifted between the high and low voltage levels.

For better understanding of the prior-art latching circuit, description is hereinunder made for the latching operation with reference to FIG. 2 of the drawings. Prior to starting the latching operation ( or at time t40 ), the input signal Din1, the clock signal CLK and the output signal Dout1 remain in the low voltage levels ( or the negative voltage levels Vss1 and Vss2 ), and, accordingly, the complementary input signal Din2 and the complementary output signal Dout2 are shifted to the high voltage level ( or the ground voltage level and the negative voltage level Vss1 ). The nodes N31 and N34 are in the low voltage level ( or the negative voltage level Vss1 ) and the high voltage level ( or the ground voltage level ), respectively.

If the input signal Din1 goes up to the high voltage level and, accordingly, the complementary input signal is recovered to the low voltage level at time t41, no latching operation is achieved in this stage, because the clock signal CLK is not altered in the voltage level. With the complementary input signal Din2 of the low voltage level and the clock signal CLK of the low voltage level, both of the depletion type field effect transistors Q32 and Q33 are turned off to cut off a conduction path between the negative voltage source Vss1 and the node N31. However, the depletion type field effect transistor Q34 is turned on to provide a conduction path between the negative voltage level Vss1 and the node N31, because the complementary output signal of the high voltage level is supplied to the gate electrode thereof, thereby allowing the depletion type field effect transistor Q35 to be turned off. Then, the depletion type field effect transistor Q35 remains in the off-state, and, accordingly, the output signal Dout1 of the low voltage level continues to be produced on the basis of the negative voltage level Vss2. On the other hand, the node N34 is kept in the high voltage level due to the depletion type field effect transistors Q38 and Q3a in the respective off states, and, for this reason, the depletion type field effect transistor Q3b is turned on to produce the output signal of the high voltage level.

At time t42, the clock signal CLK is shifted from the low voltage level to the high voltage level, then both of the depletion type field effect transistors Q32 and Q38 turn on, thereby allowing the node N34 to go down toward the low voltage level. The node N34 reaches the low voltage level at time t43 to cause the depletion type field effect transistor Q3b to turn off, however, the complementary output signal Dout2 reaches the low voltage level at time t45 due to the accumulation of the negative charges to the capacitor C32.

When the complementary output signal Dout2 is lowered under the threshold level of the depletion type field effect transistor Q34 ( or at time t44 ), the node N31 goes up to the high voltage level, and, for this reason, the depletion type field effect transistor turns on to allow the capacitor C31 to discharge the accumulated negative charges. As a result, the output signal Dout1 reaches the high voltage level at time t46. After the output signals Dout1 and Dout2 are respectively shifted in the voltage level, the clock signal CLK is recovered to the low voltage level at time t47, and the latching operation is completed.

A problem is encountered in the prior-art latching circuit in prompt response to the alternation of the input signals Din1 and Din2. THis is because of the fact the depletion type field effect transistors Q34 and Q3a are incorporated in the prior-art latching circuit for preventing the output signal Dout1 or Dout2 from the insufficient negative voltage level. The depletion type field effect transistors Q34 and Q3a are shifted in series due to accumulation of the negative charges to one of the capacitors followed by discharging the other capacitor, and, as a result, a prolonged time period is consumed from alternation of the clock signal ( or time t42 ) to the completion of the shifting operation ( or time t46 ).

If the depletion type field effect transistors Q35, Q36, Q3b and Q3c are selected to be larger in channel conductance, the consumed time period may be decreased, however, a considerable amount of current is consumed in the level shifters of the latching circuit. In a practical application, development efforts are made for reduction in the current consumption. Then, the above solution is not feasible. On the other hand, the depletion type field effect transistors Q35, Q36, Q3b and Q3c tend to be decreased in channel conductance for reduction in the amount of current consumed. In fact, if the level shifters formed by those depletion type field effect transistors are decreased in current driving capability to a third, the time interval of 5t measuring from time t42 to time t46 is prolonged to be as long as about 4.2 times of the time interval. The prolonged time interval TL is calculated as follows:

$$TL = 4t \times 3 + 4t \times (\tfrac{1}{3}) \times 3 = 21t$$

SUMMARY OF THE INVENTION

It is therefore an important object of the present invention to provide a latching circuit which consumes a relatively short time period without sacrifice of the amount of current consumed.

To accomplish these objects, the present invention proposes to provide level shifters connected to the depletion type field effect transistors of the controller.

In accordance with the present invention, there is provided a latching circuit comprising (a) two NAND gates one of which is responsive to an input signal and an enable signal to produce an output signal and the other of which is responsive to the inverse of the input signal and the enable signal to produce the inverse of the output signal, (b) two level shifting circuits responsive to the output signal and the inverse of the output signal, respectively, and operative to shift the output signal and the inverse of the output signal in voltage level by a predetermined value to produce a latching signal and the inverse of the latching signal which are supplied to output nodes thereof, respectively, and (c) a controller operative to provide the two level shifting circuits with a predetermined voltage level which partially define respective alternation ranges of the latching signal and the inverse of the latching signal, wherein each of the level shifting circuit comprises a capacitor coupled to the output node and first and second level shifters connected to the capacitor and the controller, respectively.

BRIEF DESCRIPTION OF THE DRAWINGS

The features and advantages of a latching circuit according to the present invention will be more clearly understood from the following description taken in conjunction with the accompanying drawings in which.

DESCRIPTION OF THE PREFERRED EMBODIMENTS

First Embodiment

Figure 1:
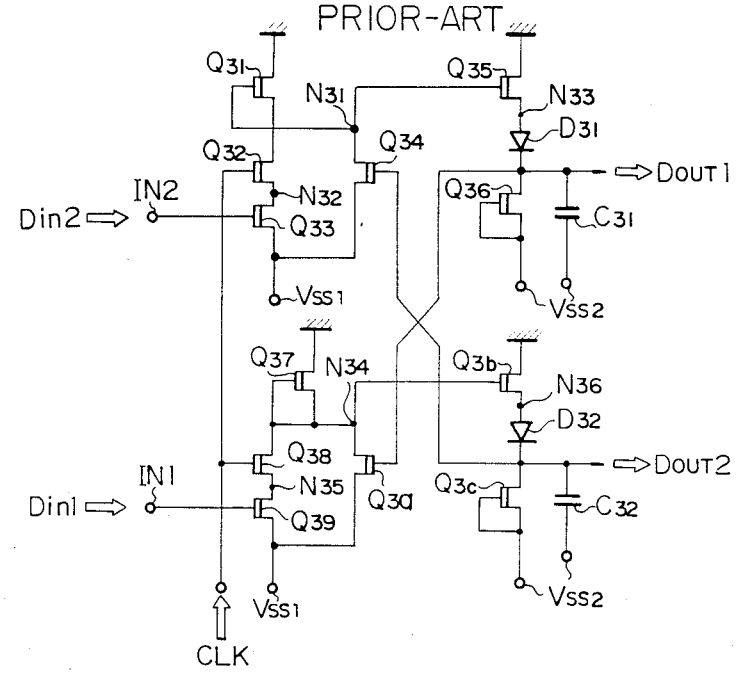
FIG. 1 is a diagram showing the circuit arrangement of a prior-art latching circuit.
Figure 2:
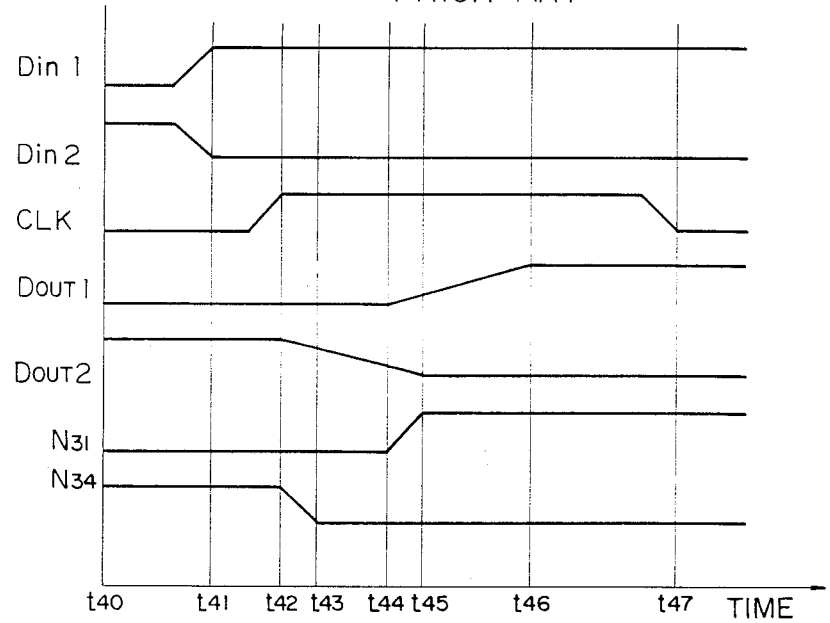
FIG. 2 is a time chart for describing the latching operation achieved by the prior-art latching circuit.
Figure 3:
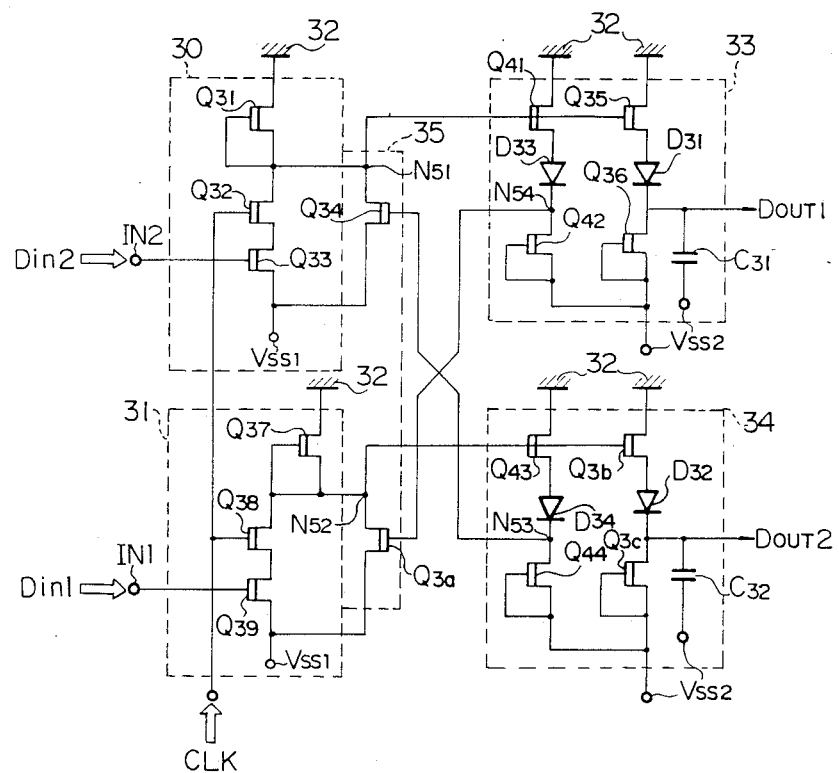
FIG. 3 is a diagram showing the circuit arrangement of a latching circuit embodying the present invention.

Referring first to FIG. 3 of the drawings, there is shown the circuit arrangement of the latching circuit embodying the present invention. The latching circuit shown in FIG. 3 is implemented by depletion type MES ( metal-semiconductor ) field effect transistors formed by using compound semiconductors and is incorporated in a random access memory device.

The latching circuit shown in FIG. 3 largely comprises two NAND gates 30 and 31 coupled between a ground voltage source 32 and a first negative voltage source Vss1, two level shifting circuits 33 and 34 coupled between the ground voltage source 32 and a second negative voltage source Vss2, and a controller 35 for the level shifting circuits 33 and 34. In this instance, the first and second negative voltage sources Vss1 and Vss2 produces first and second negative voltage levels of about $-1.5$ volt and about $-3.3$ volts, respectively.

The NAND gate 30 is provided with a series combination of three depletion type field effect transistors Q31, Q32 and Q33, and the NAND gate 31 is also provided with a series combination of three depletion type field effect transistors Q37, Q38 and Q39. Both of the NAND gates 30 and 31 are of the two-input type, and an input signal Din1 and the complementary input signal Din2 are supplied to respective first input nodes of the NAND gates 31 and 30. However, a clock signal CLK is shared by the respective second input nodes of the NAND gates 30 and 31.

The level shifting circuit 33 comprises a first series combination of a depletion type field effect transistor Q35, a diode D31 and a depletion type field effect transistor Q36, a second series combination of a depletion type field effect transistor Q41, a diode D33 and a depletion type field effect transistor Q42, and a capacitor C31. Similarly, the level shifting circuit 34 has a first series combination of a depletion type field effect transistor Q3b, a diode D32 and a depletion type field effect transistor Q3c, a second series combination of a depletion type field effect transistor Q43, a diode D34 and a depletion type field effect transistor Q44, and a capacitor C32. Those series combinations serves as respective level shifters.

The controller 35 comprises two depletion type field effect transistors Q34 and Q3a which are provided in association with the NAND gates 30 and 31, respectively, for preventing an output signal Dout1 and the complementary output signal Dout2 from excessing a predetermined high level selected between the ground voltage level and the negative voltage level Vss2. N51, N52, N53 and N54 stand for respective nodes which appear in the following description for the latching operation.

Figure 4:
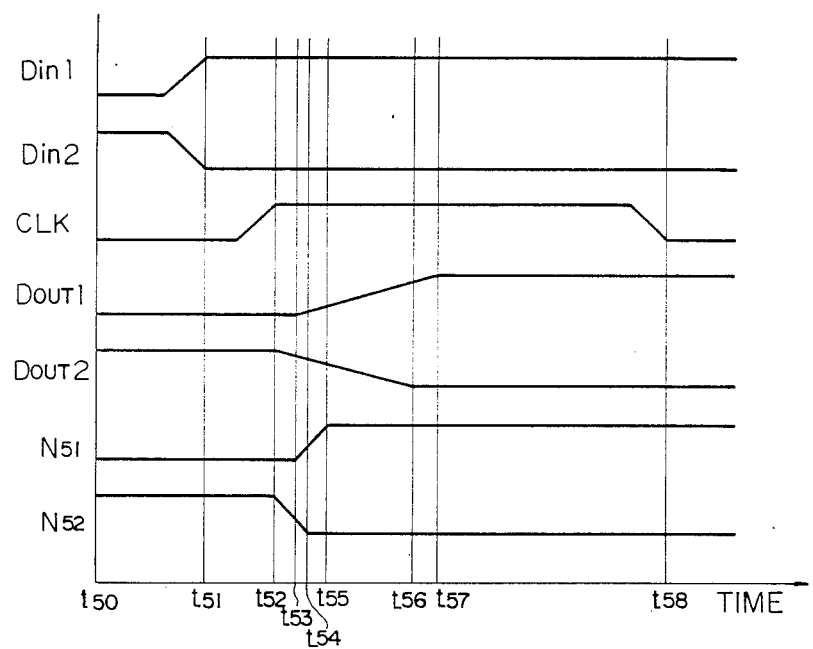
FIG. 4 is a time chart for describing the latching operation achieved by the latching circuit shown in FIG. 3.

Description is made for the latching operation with reference to FIG. 4 of the drawings. At time t50, the input signal Din1 remains in the low voltage level ( or the first negative voltage level Vss1 ) and, accordingly, the complementary input signal Din2 is in the high voltage level or the ground voltage level. The clock signal CLK is in the low voltage level ( or the first negative voltage level ), the nodes 51 and 52 remain in the low voltage level ( or the first negative voltage level ) and the high voltage level or the ground level, respectively. As a results, the output signal Dout1 remains in the low voltage level ( or the second negative voltage level ), and, accordingly, the complementary output signal Dout2 is in the high voltage level or the predetermined negative voltage level.

If the input signal Din1 is shifted to the high level at time t51, the complementary input signal Din2 is recovered to the low voltage level. Since the clock signal remains in the low voltage level, no alternation in voltage level takes place in the nodes N51 and N52. However, if the clock signal CLK is shifted from the low voltage level to the high voltage level at time t52, the node N52 goes down to the low voltage level, because both of the depletion type field effect transistors Q38 and Q39 turn on to provide a conduction path from the second negative voltage source Vss1 to the node N52. Then, the node N52 goes down toward the low voltage level and reaches the low voltage level at time t54. If the node N52 goes down across the threshold level of the depletion type field effect transistors Q43 and Q3b at time t53, the depletion type field effect transistors Q3b and Q43 turn off and, accordingly, the node N53 rapidly goes down to the low voltage level. This is because of the facts that the node N53 is connected to the depletion type field effect transistor Q34 and that the capacitor C32 is accumulated with the negative charges through the depletion type field effect transistor Q3c. This results in that the node N51 begins to go up to the high voltage level even if the complementary output signal Dout2 is still on the way to the low voltage level.

When the node N51 begins to go up to the high voltage level, the depletion type field effect transistor Q41 and Q35 are gradually increased in channel conductance. In this behaviour, the second series combination of the level shifting circuit 33 is connected to the depletion type field effect transistor Q3a only, and, for this reason, the depletion type field effect transistor Q3a promptly completes the shifting function, thereby causing the node N51 to rapidly reach the high voltage level at time t55.

After the complementary output signal Dout2 and the output signal Dout1 reach the respective low and high voltage levels at times t56 and t57, respectively, the clock signal CLK is recovered to the low voltage level, and the latching operation is completed.

Second Embodiment

Figure 5:
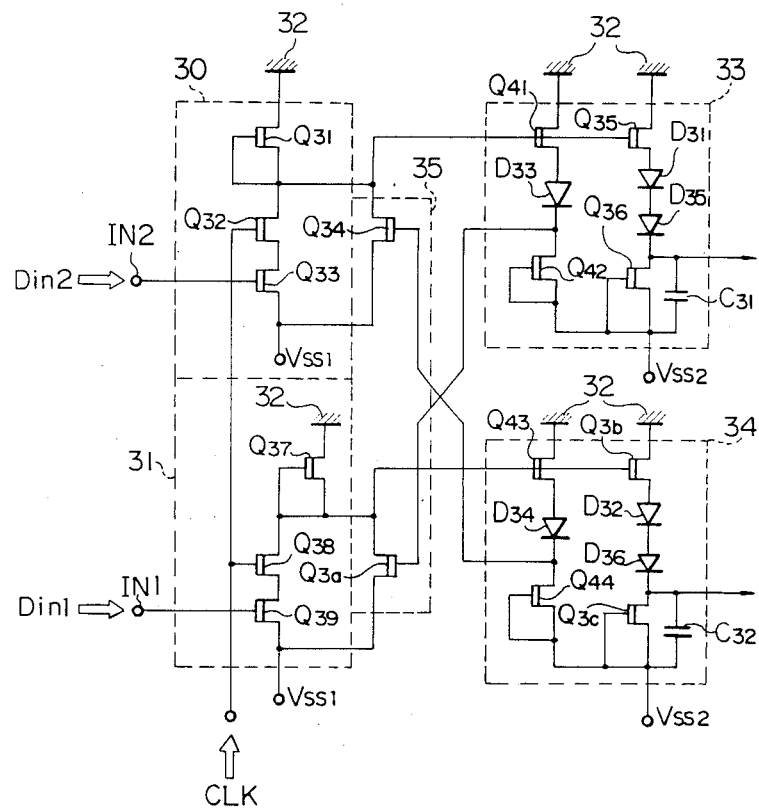
FIG. 5 is a diagram showing the circuit arrangement of another latching circuit embodying the present invention.

Turning to FIG. 5 of the drawings, there is shown the circuit arrangement of another latching circuit embodying the present invention. The latching circuit illustrated in FIG. 5 is similar in circuit arrangement to the latching circuit shown in FIG. 3 except for the respective first series combinations of the level shifting circuits 33 and 34. Then, description is focused upon the first series combinations only, and like reference numerals and symbols designate the corresponding component elements of the latching circuit for the sake of simplicity.

The respective first series combinations of the level shifting circuits 33 and 34 has respective diodes D35 and D36 coupled between the diode D31 and the depletion type field effect transistor Q36 and between the diode D32 and the depletion type field effect transistor Q3c, respectively. By virtue of each additional diode D35 or D36, the output signal Dout1 and the complementary output signal Dout2 have a high voltage level lower than that of the first embodiment by the forward basing voltage level of the diode which is about 0.5 volt in this instance.

Although particular embodiments of the present invention have been shown and described, it will be obvious to those skilled in the art that various changes and modifications may be made without departing from the spirit and scope of the present invention.

What is claimed is:

1. A latching circuit comprising:
a first NAND gate having a first input end receiving a first input signal, a second input end receiving an enable signal and an output end, a second NAND gate having a first input end receiving a second input signal complementary to said first input signal, a second input end receiving said enable signal and an output end, each of said first and second NAND gates including first and second transistors connected in series between the output end thereof and a first voltage terminal and having gates coupled to the first and second input ends thereof, respectively, and a load element coupled between the output end thereof and a second voltage terminal, a first level shift circuit having an input end connected to the output end of said first NAND gate and an output end, a second level shift circuit having an input end connected to the output end of said second NAND gate and an output end, a third level shift circuit having an input end connected to the output end of said first NAND gate and an output end, a fourth level shift circuit having an input end connected to the output end of said second NAND gate and an output end, a first feedback transistor having a current path connected between the output end of said first NAND gate and said first voltage terminal and a gate, a second feedback transistor having a current path connected between the output end of said second NAND gate and said first voltage terminal and a gate, means for connecting the output end of said third level shift circuit to the gate of said second feedback transistor, means for connecting the output end of said fourth level shift circuit to the gate of said first feedback transistor, a first output terminal coupled to the output end of said first level shift circuit without connection to the output end of said third level shift circuit, and a second output terminal coupled to the output end of said second level shift circuit without connection to the output end of said fourth level shift circuit.

2. A latching circuit as set forth in claim 1, in which said first level shift circuit comprises a series combination of a third depletion type field effect transistor, a first diode and a fourth depletion type field effect transistor, said first level shift circuit being coupled between said second voltage terminal and a third voltage terminal and in which said third and fourth depletion type field effect transistors have respective gate electrodes coupled to the output end of said first NAND gate and said third voltage terminal, respectively, wherein said first output terminal is coupled between said first diode and said fourth depletion type field effect transistor.

3. A latching circuit as set forth in claim 2, in which said second level shift circuit comprises a series combination of a fifth depletion type field effect transistor, a second diode and a sixth depletion type field effect transistor, said second level shift circuit being coupled between said second voltage terminal and said third voltage terminal and in which said fifth and sixth depletion type field effect transistors have respective gate electrodes coupled to the output end of said second NAND gate and said third voltage terminal, respectively, wherein said second output terminal is coupled between of said second diode and said sixth depletion type field effect transistor.

4. A latching circuit as set forth in claim 3, in which said third level shift circuit comprises a series combination of a seventh depletion type field effect transistor, a third diode and an eighth depletion type field effect transistor, said third level shift circuit being coupled between said second voltage terminal and said third voltage terminal and in which said seventh and eighth depletion type field effect transistors have respective gate electrodes coupled to the output end of said first NAND gate and said third voltage terminal, respectively, wherein the output end of said third level shift circuit is coupled between said third diode and said eighth depletion type field effect transistor.

5. A latching circuit as set forth in claim 4, in which said fourth level shift circuit comprises a series combination of a ninth depletion type field effect transistor, a fourth diode and a tenth depletion type field effect transistor, said fourth level shift circuit being coupled between said second voltage terminal and said third voltage terminal and in which said ninth and tenth depletion type field effect transistors have respective gate electrodes coupled to the output end of said second NAND gate and said third voltage terminal, respectively, wherein the output end of said fourth level shift circuit is coupled between said fourth diode and said tenth depletion type field effect transistor.

6. A latching circuit as set forth in claim 5, in which said first and second transistors are depletion type field effect transistors and in which said load element of each of said first and second NAND gates is implemented by a depletion type field effect transistor.

7. A latching circuit as set forth in claim 6, in which said first and second feedback transistors are each a depletion type field effect transistor.

* * * * *